(12) United States Patent
Yang et al.

(10) Patent No.: US 6,423,612 B1
(45) Date of Patent: Jul. 23, 2002

(54) METHOD OF FABRICATING A SHALLOW TRENCH ISOLATION STRUCTURE WITH REDUCED TOPOGRAPHY

(75) Inventors: Wenge Yang, Fremont; John Jianshi Wang; Fei Wang, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/604,547

(22) Filed: Jun. 26, 2000

(51) Int. Cl.[7] .............................................. H01L 21/336
(52) U.S. Cl. ....................................... 438/424; 438/289
(58) Field of Search ............................... 438/289, 300, 438/395, 183, 257, 332

(56) References Cited

U.S. PATENT DOCUMENTS

| 5,492,858 A | 2/1996 | Bose et al. |
|---|---|---|
| 5,498,565 A | 3/1996 | Gocho et al. |
| 5,728,621 A | 3/1998 | Zheng et al. ................ 438/427 |
| 5,854,114 A | 12/1998 | Li et al. ..................... 438/296 |
| 6,162,688 A | * 12/2000 | Gardner et al. ............. 438/289 |

* cited by examiner

*Primary Examiner*—David Nelms
*Assistant Examiner*—Dung Anh Le
(74) *Attorney, Agent, or Firm*—Skjerven Morrill MacPherson LLP; Norman R. Klivans

(57) ABSTRACT

A shallow trench isolation (STI) region is covered with a nitride layer. The nitride layer, advantageously, fills in gaps in the underlying dielectric layer, such as seams, thereby reducing leakage. The nitride layer may be patterned to form a spacer above the STI region which is used to define an opening in the polysilicon layer that is subsequently deposited. The polysilicon layer is etched back to expose the nitride spacer, which is then etched away in a controlled fashion. Thus, a small opening may be formed in the polysilicon layer. Further, because the polysilicon layer is etched back to the top of the nitride spacer, the polysilicon layer is planarized thereby reducing stringers in subsequent processing.

5 Claims, 2 Drawing Sheets

METHOD OF FABRICATING A SHALLOW TRENCH ISOLATION STRUCTURE WITH REDUCED TOPOGRAPHY

FIELD OF THE INVENTION

The present invention relates to isolation regions used in semiconductor integrated circuits, and in particular to the formation of a shallow trench isolation structure.

BACKGROUND

The trend in semiconductor integrated circuits is to increase the density of the number of devices in a silicon substrate area. The density is dependent on not only the area of the device, but on the area required to separate or isolate one device from another. Increased density is particularly advantageous in, for example, non-volatile memory devices, such as erasable and electrically programmable read-only memory (EPROM) cells; electrically, erasable programmable read-only memory (EEPROM) cells; and Flash EEPROM cells useful in memory arrays and programmable logic devices.

Isolation regions, such as shallow trench isolation (STI) structures, are used commonly in the semiconductor industry to prevent parasitic channels between adjacent devices. STI is advantageous because fine trenches can be formed thereby reducing the isolation area and increasing density.

FIG. 1 shows a conventional method of forming a STI structure that is used, e.g., in a Flash memory device. FIG. 1 shows a silicon substrate 10 with a STI region 12. STI region 12 includes a trench 14 that is lined with a thermal oxide layer 16. The trench 14 is filled with a TEOS (tetra-ethyl-orotho-silicate) layer 18. The TEOS layer 18 is generally applied to a thickness so that the top of the TEOS layer 18 is about the same level as the top of a nitride layer (not shown). The nitride layer and an underlying oxide layer are then stripped off, leaving the top of TEOS layer 18 higher than silicon substrate 10. A polycrystalline silicon (polysilicon) layer 20 is then deposited over TEOS layer 18 and silicon substrate 10.

As shown in FIG. 1, a seam 22 is produced in TEOS layer 18. Unfortunately, when polysilicon layer 20 is deposited over STI region 12, seam 22 is filled with polysilicon, which leads to interpolysilicon shorts and creates leakage.

The polysilicon layer 20 is then covered with a photoresist (not shown) which is patterned. The patterned photoresist and underlying polysilicon is etched away resulting in the structure shown in FIG. 2. As can be seen in FIG. 2, polysilicon layer 20 is patterned with space 24. Because polysilicon layer 20 is conventionally etched in an anisotropic etch process, a space 24 that is less than 0.2 μm is difficult to define.

Moreover, polysilicon layer 20 has large step heights, as shown in FIGS. 1 and 2. Thus, subsequent processing steps may have problems with material not completely etching off the sidewalls, i.e., stringers, which may lead to shorts.

Thus, what is needed is a STI structure that may be used in a densely packed array, such as in Flash memory, and that will eliminate problems associated with interpolysilicon shorts, stringers, and may easily define small spaces in the polysilicon layer overlaying the STI region.

SUMMARY

In accordance with an embodiment of the present invention, a semiconductor device, such as Flash memory, includes a STI region in a substrate. After removing the pad oxide and nitride layers over the substrate, a nitride layer is deposited. The nitride layer is patterned and etched to produce a nitride spacer, for example, above the STI region. Advantageously, nitride from the nitride layer will fill any seams present in the dielectric layer of the STI, thereby reducing leakage. A polysilicon layer is deposited and etched back to the top of the nitride spacer. Thus, the polysilicon layer is formed with an approximately planar topology, thereby reducing stringers in subsequent processing. The nitride spacer is then etched away leaving a space in the polysilicon layer. Because a nitride spacer is used to define the size of the space in the polysilicon layer, a small space may be easily produced.

Thus, an apparatus, such as a Flash memory is produced that includes a substrate with a STI region. The STI region includes a dielectric layer with a seam, which is filled with nitride. At least a portion of the STI region is covered with a polysilicon layer having a top surface that is approximately planar. The polysilicon layer may have an opening over the STI region.

DETAILED DESCRIPTION

Figure 1:
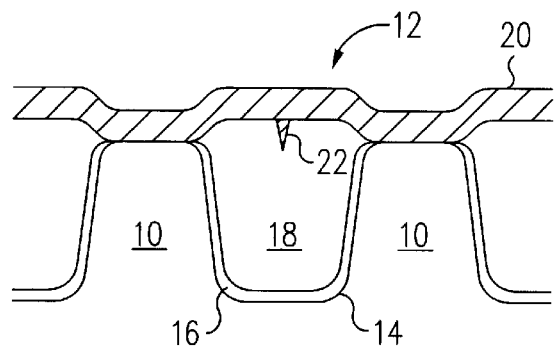
FIGS. 1 and 2 show cut-away views of conventional processing of shallow trench isolation regions and overlaying layers.
Figure 2:
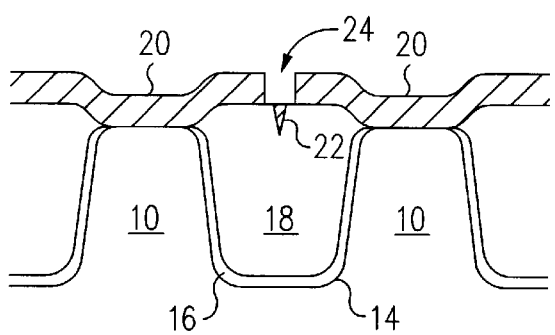
Figure 3:
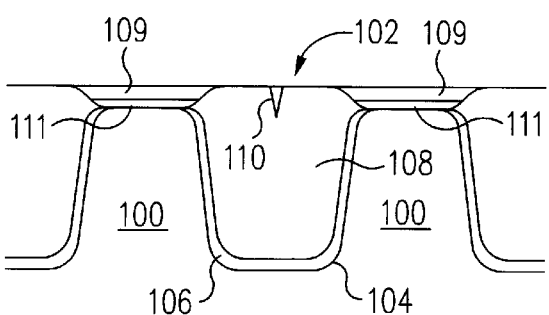
FIGS. 3–8 show cut-away views of processing of shallow trench isolation regions and overlaying layers in accordance with an embodiment of the present invention.

FIG. 3 shows a semiconductor substrate 100 with a partially produced STI region 102. STI region 102 includes a trench 104 and a thin thermal oxide layer 106 that lines trench 104. Trench 104 is conventionally formed using an anisotropic etch process and is, for example, 4000 to 8000 Å deep and 2000 to 5000 Å wide. Thermal oxide layer 106 is conventionally grown on the sidewalls and bottom of the trench 104 and is approximately 300 to 500 Å thick. A TEOS (tetra-ethyl-orotho-silicate) layer 108 is deposited to fill trench 104 and serves as a conformal dielectric layer.

Figure 4:
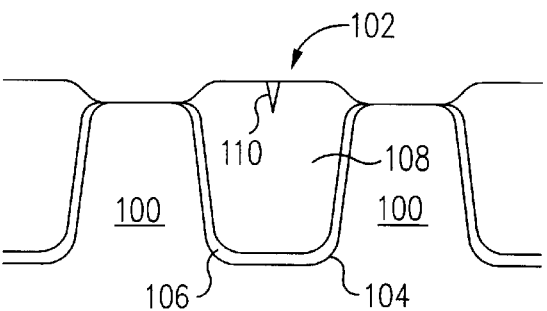

The TEOS layer 108 is then annealed at about 1050° C. in a nitrogen atmosphere to densify the oxide. The TEOS layer 108 is etched until the top surface of a nitride layer 109 is exposed. Nitride layer 109 overlies oxide layer 111. A seam 110 present in TEOS layer 108 is formed during the deposition of TEOS layer 108. The nitride layer 109 and oxide layer 111 are stripped leaving TEOS layer 108 extending above silicon substrate 100 as shown in FIG. 4.

Figure 5:
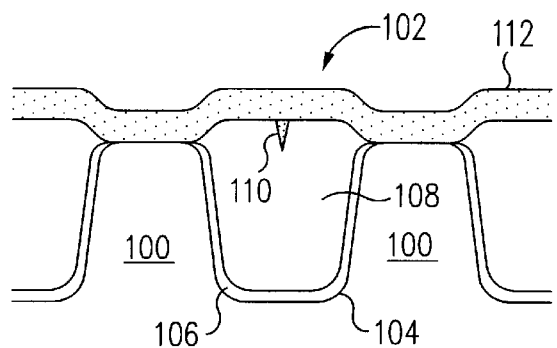

FIG. 5 shows semiconductor substrate 100 and STI region 102 with an overlaying nitride layer 112. Nitride layer 112 is deposited via e.g., chemical vapor deposition (CVD), to a thickness of approximately 2000 to 3000 Å. Advantageously, by overlaying nitride layer 112 over STI region 102, seam 110 is filed with nitride, which helps prevent leakage.

Figure 6:
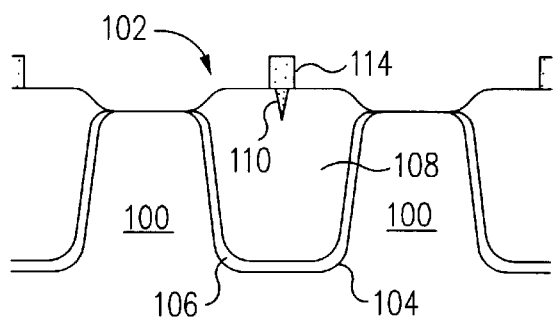

A photoresist masking layer is applied over nitride layer 112 and conventionally patterned. The exposed areas are etched, for example, through dry etching with CF4 plasma, resulting in the structure shown in FIG. 6. The patterning of nitride layer 112 produces nitride spacer 114, which is what will define the subsequent polysilicon spacing.

Figure 7:
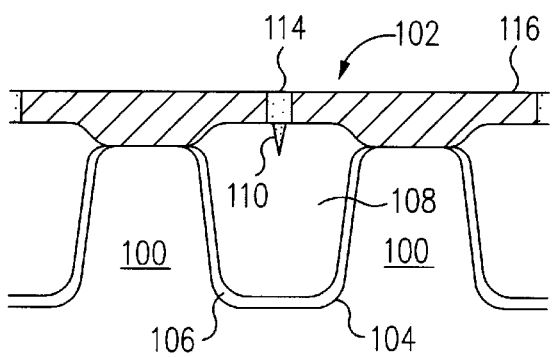

Next, a polysilicon layer 116 is deposited, using CVD or other conventional method, to a thickness sufficient to cover nitride spacer 114, e.g., 35 μm to 45 μm. Polysilicon layer 116 is then polished back, for example, using chemical mechanical polishing, resulting in the structure shown in FIG. 7. As can be seen in FIG. 7, because polysilicon layer 116 is polished back to nitride spacer 114, polysilicon layer 116 is approximately planar. The flat topography of polysilicon layer 116 advantageously eliminates stringer problems.

Figure 8:
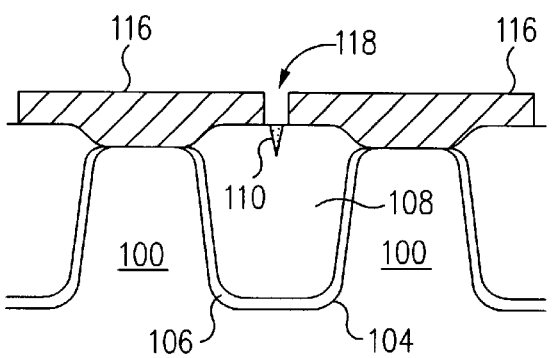

The nitride spacer 114 is then stripped using, e.g., dry etching with $CF_4$ plasma. The stripping of nitride spacer 114 will not etch into the nitride of seam 110 by any significant amount. It is believed that the nitride in seam 110 is not etched due, at least in part, to the small size of the seam 110. Thus, approximately planar polysilicon layer 116 will have spaces 118 as shown in FIG. 8, which may be approximately 0.2 μm or less. Advantageously, the width of spaces 118 is determined by the width of nitride spacers 114 and thus may be easily controlled.

While the present invention has been described in connection with specific embodiments, variations of these embodiments will be obvious to those of ordinary skill in the art. It is understood that conventional process steps are used where necessary, as is well understood in the art. Therefore, the spirit and scope of the appended claims should not be limited to the foregoing description.

What is claimed is:

1. A method comprising:

providing a substrate;

providing a shallow trench isolation region in the substrate;

depositing a nitride layer over the shallow trench isolation region;

etching the nitride layer to produce a nitride spacer;

depositing a polysilicon layer; and etching the nitride spacer to produce a space in the polysilicon layer.

2. The method of claim 1, further comprising planarizing the polysilicon layer before etching the nitride spacer.

3. The method of claim 2, wherein planarizing the polysilicon layer comprises polishing the polysilicon layer.

4. The method of claim 1, wherein the nitride spacer is located over the shallow trench isolation region.

5. The method of claim 1, further comprising stripping a nitride layer and an oxide layer off the silicon substrate prior to depositing the nitride layer.

\* \* \* \* \*